US012772387B2

(12) United States Patent
Ohashi et al.

(10) Patent No.: US 12,772,387 B2

(45) Date of Patent: Oct. 20, 2026

(54) LIQUID TRANSFER DEVICE FOR FORMING LIQUID FILM ON A SURFACE OF A TRANSFER TABLE

(71) Applicant: FUJI CORPORATION, Chiryu (JP)

(72) Inventors: Hiroyasu Ohashi, Toyota (JP); Toshihiro Nonomura, Toyota (JP); Masaaki Senzaki, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 18/833,214

(22) PCT Filed: Feb. 24, 2022

(86) PCT No.: PCT/JP2022/007715

§ 371 (c)(1),
(2) Date: Jul. 25, 2024

(87) PCT Pub. No.: WO2023/162105

PCT Pub. Date: Aug. 31, 2023

(65) Prior Publication Data

US 2025/0113444 A1 Apr. 3, 2025

(51) Int. Cl.
*B23K 3/08* (2006.01)
*H05K 3/3489* (2026.01)
*B23K 101/42* (2006.01)

(52) U.S. Cl.
CPC ........... *H05K 3/3489* (2013.01); *B23K 3/082* (2013.01); *B23K 2101/42* (2018.08)

(58) Field of Classification Search
CPC ...................................................... B23K 3/082
See application file for complete search history.

(56) References Cited

U.S. PATENT DOCUMENTS 5,330,574 A * 7/1994 Nakagawa ........... H05K 13/028 118/425
5,680,984 A * 10/1997 Sakemi ............... H01L 21/4853 118/425

(Continued)

FOREIGN PATENT DOCUMENTS

JP 2001-85830 A 3/2001
JP 2004-330261 A 11/2004

(Continued)

OTHER PUBLICATIONS

International Search Report issued May 17, 2022 in PCT/JP2022/007715 filed Feb. 24, 2022, 2 pages.

*Primary Examiner* — Karl Kurple
(74) *Attorney, Agent, or Firm* — Oblon, McClelland, Maier & Neustadt, L.L.P.

(57) ABSTRACT

A liquid transfer device includes a transfer table, a squeegee, and a squeegee holding mechanism. The transfer table has a bottom surface on which a liquid film is formed and transfers a liquid to a transfer target by immersing the transfer target in the liquid film. The squeegee is disposed above the transfer table and pushes and spreads the liquid on the transfer table by relatively moving along the bottom surface of the transfer table to form the liquid film. The squeegee has a side surface on a traveling direction side in contact with the liquid when the squeegee relatively moves along the bottom surface of the transfer table. The side surface of the squeegee has an upward inclination or is perpendicular to the bottom surface of the transfer table. The squeegee holding mechanism holds the squeegee to be movable in a vertical direction.

5 Claims, 5 Drawing Sheets

(56) References Cited

U.S. PATENT DOCUMENTS

| | | | | |
|---|---|---|---|---|
| 5,750,199 | A * | 5/1998 | Sakemi | B23K 3/082<br>118/425 |
| 9,609,795 | B2 * | 3/2017 | Narita | H05K 13/0465 |
| 2006/0275538 | A1 * | 12/2006 | Holm | H05K 3/3485<br>427/8 |
| 2013/0093311 | A1 * | 4/2013 | Hardinger | H01L 21/6715<br>118/708 |
| 2014/0115874 | A1 * | 5/2014 | Narita | B41F 15/423<br>29/745 |
| 2017/0297131 | A1 | 10/2017 | Seyama et al. | |
| 2021/0185828 | A1 * | 6/2021 | Seyama | B23K 3/082 |

FOREIGN PATENT DOCUMENTS

| | | | |
|---|---|---|---|
| JP | 2007-216266 | A | 8/2007 |
| KR | 10-2020-0065063 | A | 6/2020 |
| WO | 2016/075982 | A1 | 5/2016 |

* cited by examiner

LIQUID TRANSFER DEVICE FOR FORMING LIQUID FILM ON A SURFACE OF A TRANSFER TABLE

TECHNICAL FIELD

The technique disclosed in the present description relates to a liquid transfer device and a method for forming a liquid film for forming a liquid film on a transfer target by immersing and transferring the transfer target to a liquid such as a flux.

BACKGROUND ART

Generally, in a process of manufacturing a circuit board on which an electronic component is mounted, a bump or a terminal of the electronic component is soldered to the circuit board. In this case, a flux is used as an auxiliary agent for improving solder wettability and the like. For example, in Patent Literature 1 (JP-A-2001-85830), a flux transfer device is set in an electronic component mounter, flux is transferred to a bump or a terminal of an electronic component in advance, and then soldering is performed.

This type of flux transfer device includes a transfer table, a squeegee, a squeegee holding mechanism, and the like. The transfer table is, for example, a plate-shaped transfer table (dip plate) provided rotatably, and stores flux. The squeegee is disposed above the dip plate and is held by the squeegee holding mechanism so as to be movable in the vertical direction. The squeegee relatively moves along the bottom surface of the dip plate as the dip plate rotates. As a result, the flux on the dip plate is uniformly pushed and spread by the squeegee, and a flux film is formed. The flux is transferred to a transfer target by immersing the bump or the terminal of the electronic component, which is the transfer target, in the formed flux film. The film thickness of the flux film is determined by the dimension of the gap between the dip plate and the squeegee. The dimension of the gap can be changed by adjusting the height position of the squeegee by operating adjusting means (for example, a squeegee fixing bolt) of the squeegee holding mechanism.

BRIEF SUMMARY

Technical Problem

In this type of flux transfer device, when the squeegee relatively moves along the bottom surface of the transfer table, the side surface of the squeegee in the traveling direction side comes into contact with the liquid such as flux. Therefore, a reaction force from the liquid such as flux acts on the side surface of the squeegee. In a conventional flux transfer device, there is a problem in that the squeegee floats or inclines due to the reaction force from the liquid such as flux acting on the side surface of the squeegee, making the film thickness of the liquid such as flux unstable.

Therefore, the present description provides a technique capable of stabilizing a film thickness of a liquid film when the liquid film is formed on a transfer target by a liquid transfer device.

Solution to Problem

The present description discloses a liquid transfer device. The liquid transfer device includes a transfer table, a squeegee, and a squeegee holding mechanism. The transfer table has a bottom surface on which a liquid film is formed and transfers a liquid to a transfer target by immersing the transfer target in the liquid film. The squeegee is disposed above the transfer table and pushes and spreads the liquid on the transfer table by relatively moving along the bottom surface of the transfer table to form the liquid film. The squeegee holding mechanism holds the squeegee to be movable in a vertical direction. The squeegee has a side surface on a traveling direction side in contact with the liquid when the squeegee relatively moves along the bottom surface of the transfer table. The side surface of the squeegee has an upward inclination or is perpendicular to the bottom surface of the transfer table.

In the above-described configuration, the quality of the liquid film formed by transfer is stabilized.

DESCRIPTION OF EMBODIMENTS

Example 1

Hereinafter, flux transfer device 10 of the present example and a method for forming flux film F2 using flux transfer device 10 will be described with reference to FIGS. 1 to 7.

Figure 1:
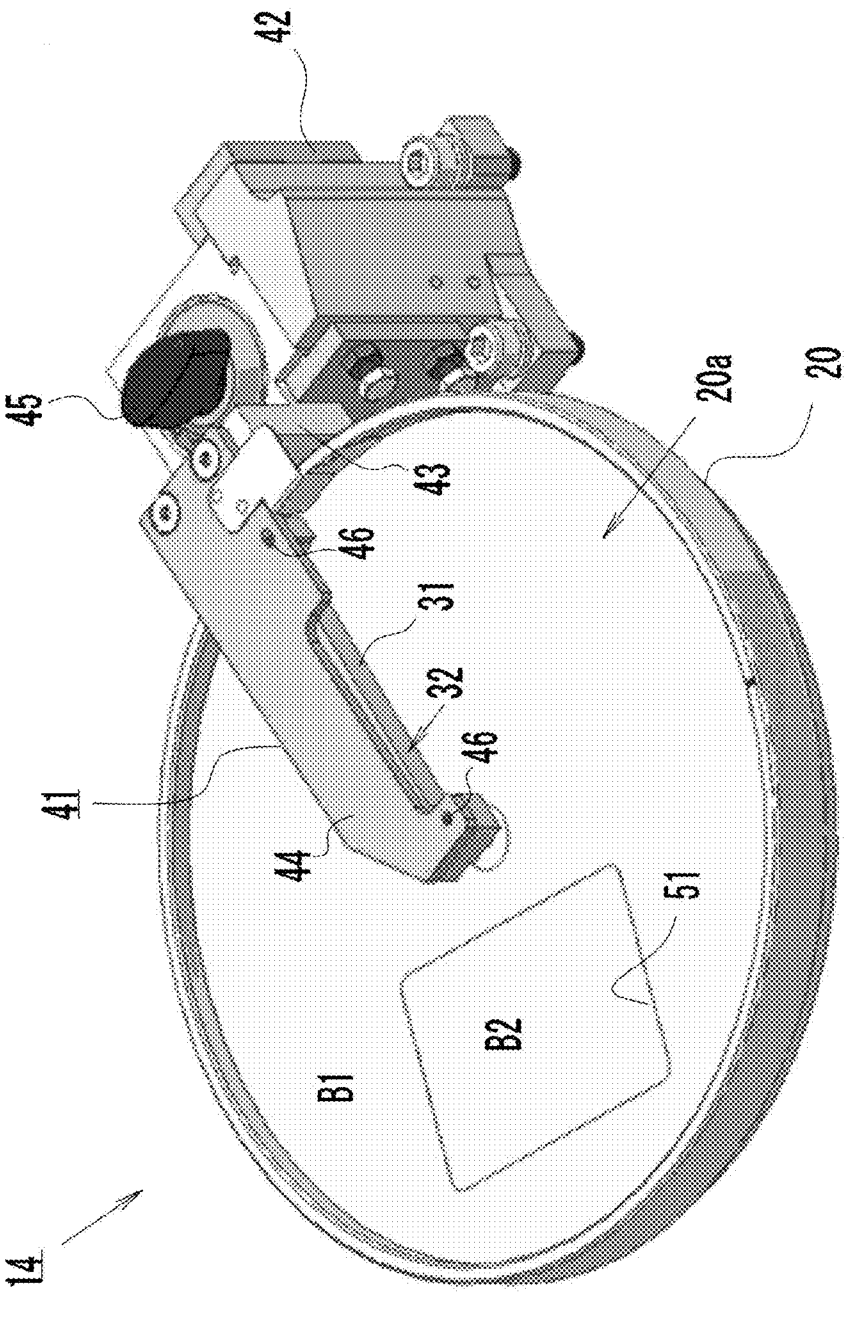
FIG. 1 is a perspective view illustrating a main part of a flux transfer device main body constituting a flux transfer device of Example 1.
Figure 2:
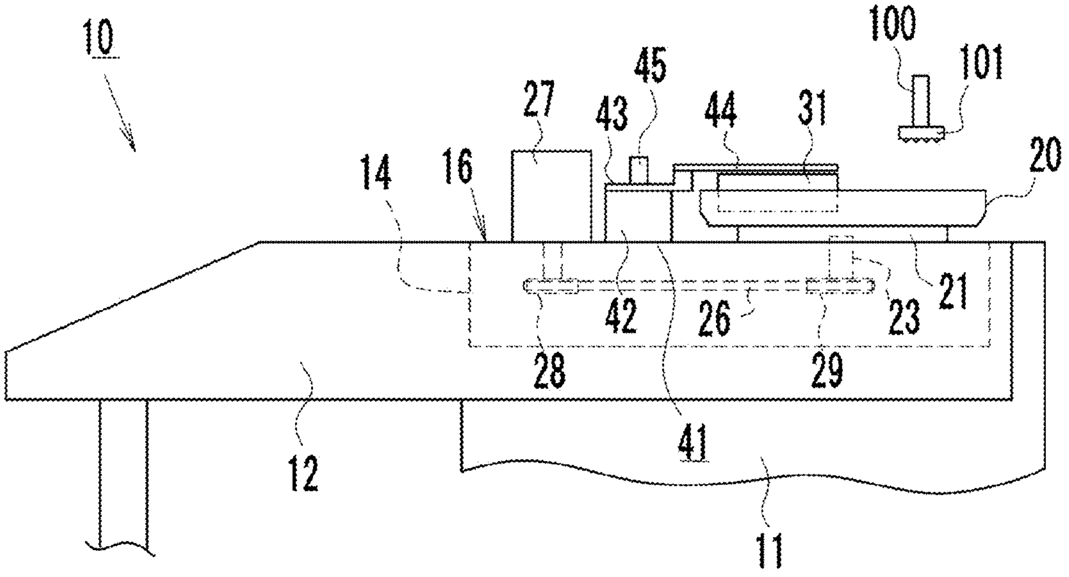
FIG. 2 is a schematic side view of the flux transfer device according to Example 1.
Figure 3:
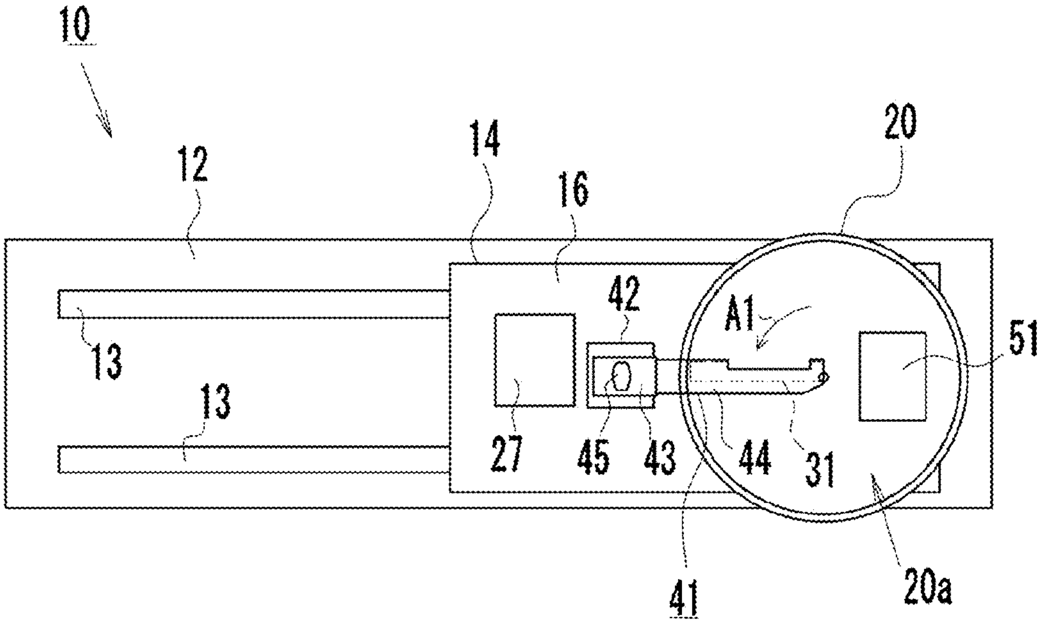
FIG. 3 is a schematic plan view of the flux transfer device according to Example 1.

As illustrated in FIGS. 1 to 3, flux transfer device 10 is used in a state of being mounted on mounting section 11 of an electronic component mounter. Flux transfer device 10 includes attachment base 12 and flux transfer device main body 14. Two guide rails 13 are provided in parallel on the upper surface of attachment base 12, and flux transfer device main body 14 is mounted on two guide rails 13. Flux transfer device main body 14 is configured to be slidable between a set position on the inside of the electronic component mounter and an outside drawing position along two guide rails 13.

Next, the configuration of flux transfer device main body 14 slidably supported on attachment base 12 will be described.

As illustrated in FIGS. 1 to 3, flux transfer device main body 14 includes dip plate 20 (an example of a transfer table), squeegee 31, squeegee holding mechanism 41, and the like on base plate 16.

Base plate 16 is provided with rotary table 21 on which dip plate 20 is placed. A magnet (not illustrated) is provided on the upper surface of rotary table 21. Dip plate 20 is formed of a magnetic material such as an iron material. Therefore, dip plate 20 is magnetically picked up to the upper surface of rotary table 21. Rotary shaft 23 is disposed at the center of rotary table 21. An upper end of rotary shaft 23 is fitted into a recessed portion formed in a central portion of a lower surface of dip plate 20 and connected thereto. Accordingly, rotary shaft 23 and dip plate 20 are integrally rotatable.

In addition, base plate 16 is provided with motor 27 serving as a drive source of dip plate 20 downward. Driving pulley 28 is fitted into a lower end of a rotary shaft of motor 27. Meanwhile, driven pulley 29 is fitted into a lower end of rotary shaft 23 connected to dip plate 20. Belt 26 is provided between driving pulley 28 and driven pulley 29. As a result, the rotational force of motor 27 is transmitted to rotary shaft 23 of rotary table 21, and rotary table 21 is rotationally driven. As a result, dip plate 20 is configured to rotate integrally with rotary table 21.

Dip plate 20 is a container for storing flux F1 in order to transfer flux F1 to the transfer target, and has circular bottom surface 20*a* on which flux film F2 is formed. Flux F1 is supplied from a flux supply device (not illustrated) installed in base plate 16 onto bottom surface 20*a* of dip plate 20.

Squeegee holding mechanism 41 for holding squeegee 31 above dip plate 20 is disposed at a position on base plate 16 near dip plate 20. Squeegee holding mechanism 41 is a mechanism that holds squeegee 31 so as to be movable in the vertical direction, and includes mechanism main body block 42, support body attachment portion 43, squeegee support body 44, fixing dial 45, and the like. Mechanism main body block 42 is placed on base plate 16, and is fixed to base plate 16 using multiple bolts. Support body attachment portion 43 is provided on one side surface of mechanism main body block 42. A proximal end portion of squeegee support body 44 is fixed to an upper end portion of support body attachment portion 43. That is, squeegee support body 44 is supported in a cantilever manner by support body attachment portion 43. Fixing dial 45 is a thumb-turn dial configured to be rotatable by 90°, for example, and can be switched to one of two positions (a fixed position and a non-fixed position). When fixing dial 45 is in the fixed position, squeegee support body 44 is fixed at a predetermined height position so as not to be movable in the vertical direction. When fixing dial 45 is in the non-fixed position, the fixing of squeegee support body 44 is released and movable in the vertical direction.

Squeegee support body 44 is a plate-shaped member formed slightly longer than the length of the radius of dip plate 20. Squeegee support body 44 is horizontally disposed above dip plate 20 along the radial direction. The proximal end portion of squeegee support body 44 is located outside the outer periphery of dip plate 20, and the distal end portion of squeegee support body 44 is located substantially at the center of dip plate 20. Squeegee 31 is disposed on the lower surface side of squeegee support body 44. Squeegee 31 is a member having substantially the same length as the radius of dip plate 20 (for example, a member made of hard rubber), and is disposed above dip plate 20 along the radial direction of dip plate 20. Squeegee 31 plays the role of uniformly pushing and spreading flux F1 on dip plate 20 and forming flux film F2 by relatively moving along bottom surface 20*a* of dip plate 20.

Columnar protruding portion 34 is disposed at each of two locations on the upper surfaces of both end portions of squeegee 31. Meanwhile, through-hole 46 passing through the upper and lower surfaces of squeegee support body 44 is formed at a location on squeegee support body 44 corresponding to protruding portion 34. Protruding portion 34 is loosely inserted into through-hole 46, so that squeegee 31 is held by squeegee support body 44 in a movable state in the vertical direction.

Figure 4:
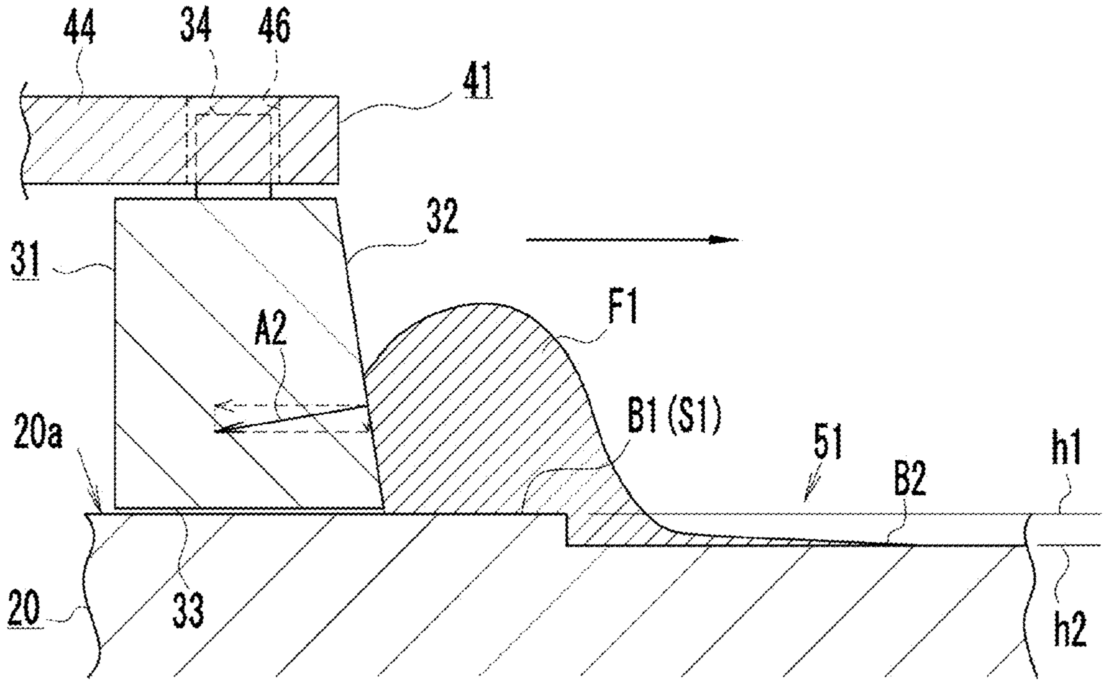
FIG. 4 is a schematic longitudinal cross-sectional view of a dip plate, a squeegee, and a squeegee holding mechanism according to Example 1.
Figure 5:
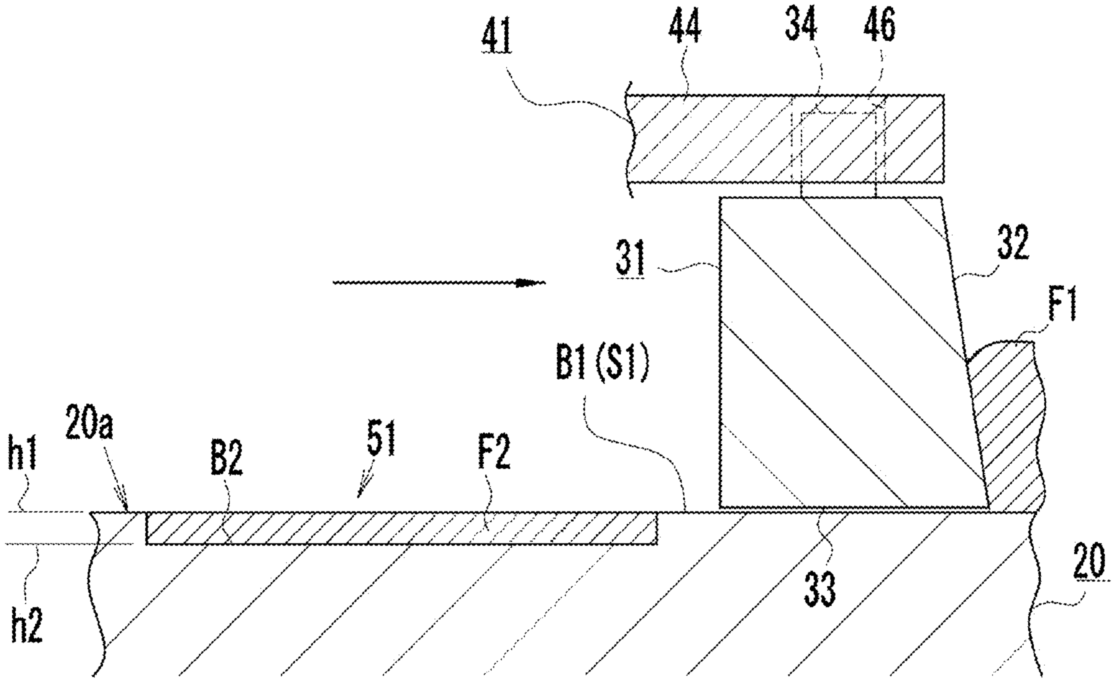
FIG. 5 is a schematic longitudinal cross-sectional view of the dip plate, the squeegee, and the squeegee holding mechanism according to Example 1.
Figure 6:
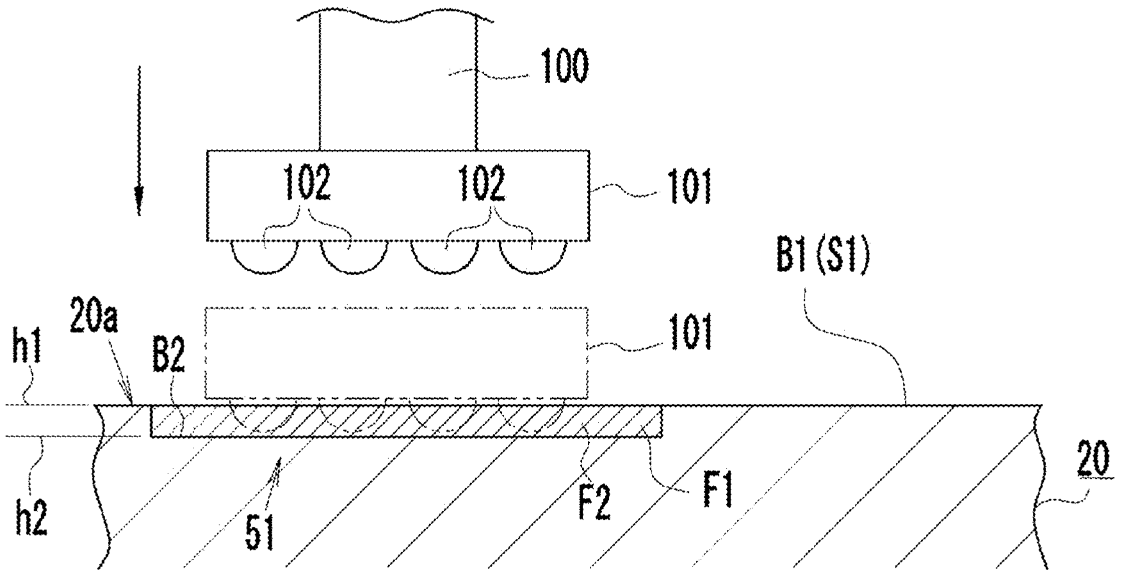
FIG. 6 is a schematic longitudinal cross-sectional view of the dip plate, the squeegee, and the squeegee holding mechanism according to Example 1.

As illustrated in FIG. 4, squeegee 31 includes side surface 32 on the traveling direction side. Side surface 32 on the traveling direction side is a surface in contact with flux F1 when squeegee 31 relatively moves along bottom surface 20*a* of dip plate 20. Squeegee 31 also includes flat lower surface 33 which abuts on bottom surface 20*a* of dip plate 20. Lower surface 33 has a positional relationship parallel to bottom surface 20*a*. In squeegee 31 of the present example, side surface 32 on the traveling direction side has an upward inclination with respect to bottom surface 20*a* of dip plate 20. The inclination angle of side surface 32 on the traveling direction side is not particularly limited and is random, but may be, for example, 1° or more with respect to the direction perpendicular to bottom surface 20*a*.

Digging processing is performed on bottom surface 20*a* of dip plate 20, and rectangular recessed portion 51 is formed in plan view by the digging processing. The length of each side of recessed portion 51 is shorter than the length of squeegee 31, and recessed portion 51 is formed at a position eccentric from the center of dip plate 20. The depth of recessed portion 51 is set in advance so as to be equal to the film thickness required for flux film F2. Bottom surface 20*a* of dip plate 20 includes first bottom surface portion B1 located at first height h1 and second bottom surface portion B2 located at second height h2 lower than first height h1. In the present example, the region of bottom surface 20*a* excluding the bottom surface of recessed portion 51 is first bottom surface portion B1, and the bottom surface of recessed portion 51 is second bottom surface portion B2. When squeegee 31 moves to the lowermost position, lower surface 33 of squeegee 31 abuts on first bottom surface portion B1 and stops. On the other hand, since second bottom surface portion B2 is in a position lower than that of first bottom surface portion B1, lower surface 33 of squeegee 31 does not abut on second bottom surface portion B2. That is, first bottom surface portion B1 of dip plate 20 also serves as stopper S1 that restricts the downward movement of squeegee 31. The film thickness of flux F1 in recessed portion 51 corresponds to the difference between first height h1 and second height h2.

Next, a method for forming flux film F2 using flux transfer device 10 described above will be described with reference to FIGS. 4 to 6.

First, a disposition step is performed, and flux F1 is disposed on bottom surface 20*a* of dip plate 20 by driving the flux supply device and supplying flux F1. After performing the disposition step, a liquid film forming step is then performed. In this step, squeegee 31 is relatively moved along bottom surface 20*a* of dip plate 20 by driving motor 27 to rotate dip plate 20 in the direction of arrow A1 in FIG. 3 (refer to FIG. 4). In other words, flux F1 disposed on dip plate 20 is pushed and spread by side surface 32 on the traveling direction side of squeegee 31. When squeegee 31 passes over recessed portion 51, flux film F2 is formed in recessed portion 51 (that is, second bottom surface portion B2) (refer to FIG. 5).

Figure 7:
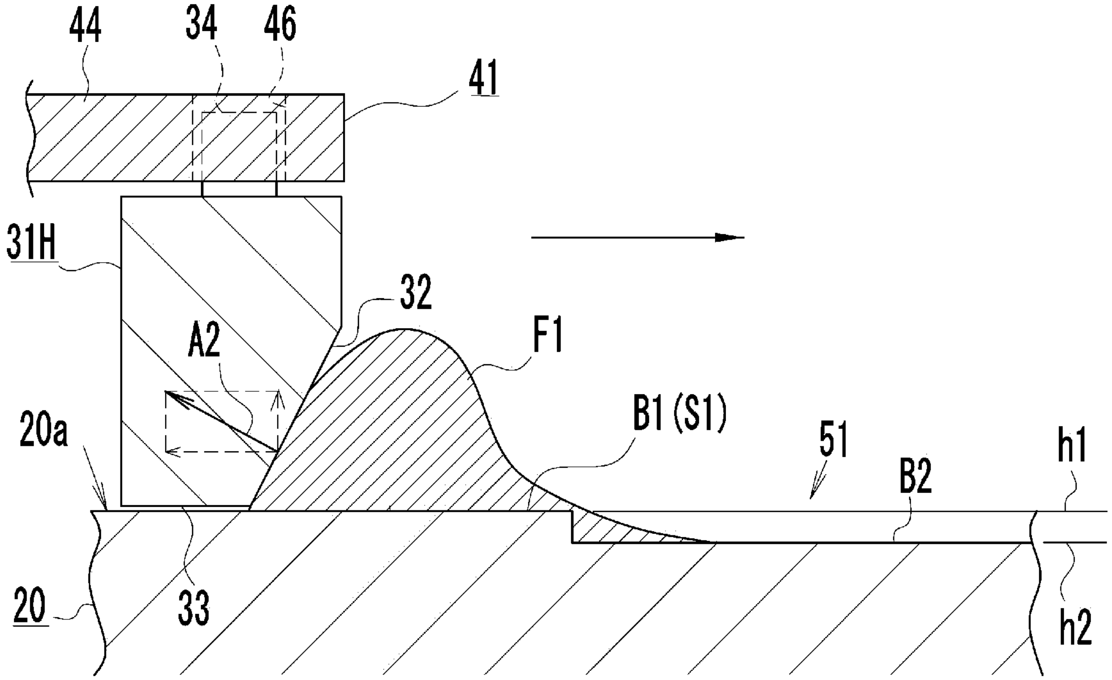
FIG. 7 is a schematic longitudinal cross-sectional view of a dip plate, a squeegee, and a squeegee holding mechanism according to a comparative example.

Here, squeegee 31H of the comparative example illustrated in FIG. 7 will be described as an example. Squeegee 31H basically has the same configuration as that of squeegee 31 of the present example, but has a different vertical cross-sectional shape. Specifically, side surface 32 on the traveling direction side of squeegee 31H of the comparative example has a downward inclination with respect to bottom surface 20*a* of dip plate 20 as illustrated in FIG. 7. When squeegee 31H is relatively moved along bottom surface 20*a* of dip plate 20, two forces act on squeegee 31H. That is, a downward force based on the weight of squeegee 31H and an obliquely upward external force (arrow A2 in FIG. 7) acting on squeegee 31H from flux F1 act. As a result, squeegee 31H is likely to be floated or inclined by the resultant force on squeegee 31H. Therefore, squeegee 31H is not held at a suitable position, and the film thickness of flux F1 is thicker or thinner than the assumed film thickness, and is likely to be unstable.

On the other hand, side surface 32 on the traveling direction side of squeegee 31 of the present example has an upward inclination with respect to bottom surface 20*a* of dip plate 20 as illustrated in FIG. 4. When squeegee 31 is relatively moved along bottom surface 20*a* of dip plate 20, two forces act on squeegee 31. That is, a downward force based on the weight of squeegee 31 and an obliquely downward external force (arrow A2 in FIG. 4) acting on squeegee 31 from flux F1 act. As a result, squeegee 31 is held at a position in the vertical direction determined by the resultant force. In this case, since at least no upward force acts on squeegee 31, squeegee 31 is no longer floated or inclined, and the film thickness of flux F1 is stabilized. Therefore, flux film F2 having a desired film thickness is formed in recessed portion 51.

After the formation of flux film F2, an immersing step is performed. In this step, electronic component 101 (transfer target) picked up and held on the lower end of vacuum chuck 100 is moved to a position above recessed portion 51. Next, electronic component 101 is moved downward to immerse bump 102 on the lower surface side in flux film F2 (refer to FIG. 6). As a result, flux F1 is transferred to the lower surface side of electronic component 101. Thereafter, a reflow step is performed through a component mounting step of mounting electronic component 101 having the flux transferred thereon onto the circuit board, and thus the soldering of electronic component 101 is completed.

When flux transfer device 10 is cleaned, fixing dial 45 of squeegee holding mechanism 41 is gripped and rotated to switch from the fixed position to the non-fixed position. As a result, the fixing of squeegee support body 44 is released, squeegee support body 44, squeegee 31, and the like can be removed, and dip plate 20 can be removed. When the cleaning operation of removed squeegee support body 44, squeegee 31, dip plate 20, and the like is finished, an attachment operation is performed in which squeegee support body 44, squeegee 31, dip plate 20, and the like are attached again. In this process, fixing dial 45 of squeegee support mechanism 41 is gripped and rotated to switch from the non-fixed position to the fixed position. As a result, squeegee support body 44 is fixed at a predetermined height position so as not to be movable in the vertical direction. That is, even when a fine adjustment of the tightening torque of the squeegee fixing bolt is not performed for the film thickness management, the transfer operation can be resumed.

As described above, in flux transfer device 10 of the present example, side surface 32 of squeegee 31 on the traveling direction side has an upward inclination with respect to bottom surface 20*a* of dip plate 20. Accordingly, when squeegee 31 relatively moves along bottom surface 20*a* of dip plate 20, an obliquely downward external force acts on side surface 32 having an upward inclination from flux F1. Accordingly, an upward force does not act on squeegee 31, squeegee 31 is no longer floated or inclined, and the film thickness of flux F1 is stabilized.

In addition, in flux transfer device 10 of the present example described above, squeegee holding mechanism 41 determines the film thickness of flux F1 by holding squeegee 31 at a position in the vertical direction determined by the weight of squeegee 31 and the external force acting on squeegee 31 from flux F1. That is, when squeegee 31 is relatively moved along bottom surface 20*a* of dip plate 20, squeegee 31 is held at a position in the vertical direction determined by the weight of squeegee 31 and the external force acting on squeegee 31 from flux F1. That is, the position of squeegee 31 in the vertical direction is determined without depending on the fine adjustment operation using adjusting means of squeegee holding mechanism 41, and squeegee 31 is held at the position. Accordingly, the complexity of the film thickness adjustment operation of flux film F2 when flux film F2 is formed on electronic component 101 is eliminated. As a result, the burden on the operator is reduced and the quality of flux film F2 formed by the transfer is stabilized. Therefore, flux film F2 having a desired film thickness can be stably formed on bottom surface 20*a* of dip plate 20.

In addition, flux transfer device 10 of the present example described above further includes stopper S1 (that is, first bottom surface portion B1 of dip plate 20) that restricts the downward movement of squeegee 31 by abutting on squeegee 31. Therefore, the downward movement of squeegee 31 is reliably restricted by stopper S1. Therefore, the gap between lower surface 33 of squeegee 31 and bottom surface 20*a* of dip plate 20 can be accurately determined.

In addition, in flux transfer device 10 of the present example described above, bottom surface 20*a* of dip plate 20 includes first bottom surface portion B1 located at first height h1 and second bottom surface portion B2 located at second height h2 lower than first height h1. In addition, first bottom surface portion B1 of dip plate 20 also serves as stopper S1, and the film thickness of flux F1 is the difference between first height h1 and second height h2. Accordingly, the film thickness of flux F1 can be accurately determined without performing the severe height position adjustment operation. Therefore, complicated operation is unnecessary, and efficiency is improved.

Example 2

Figure 8:
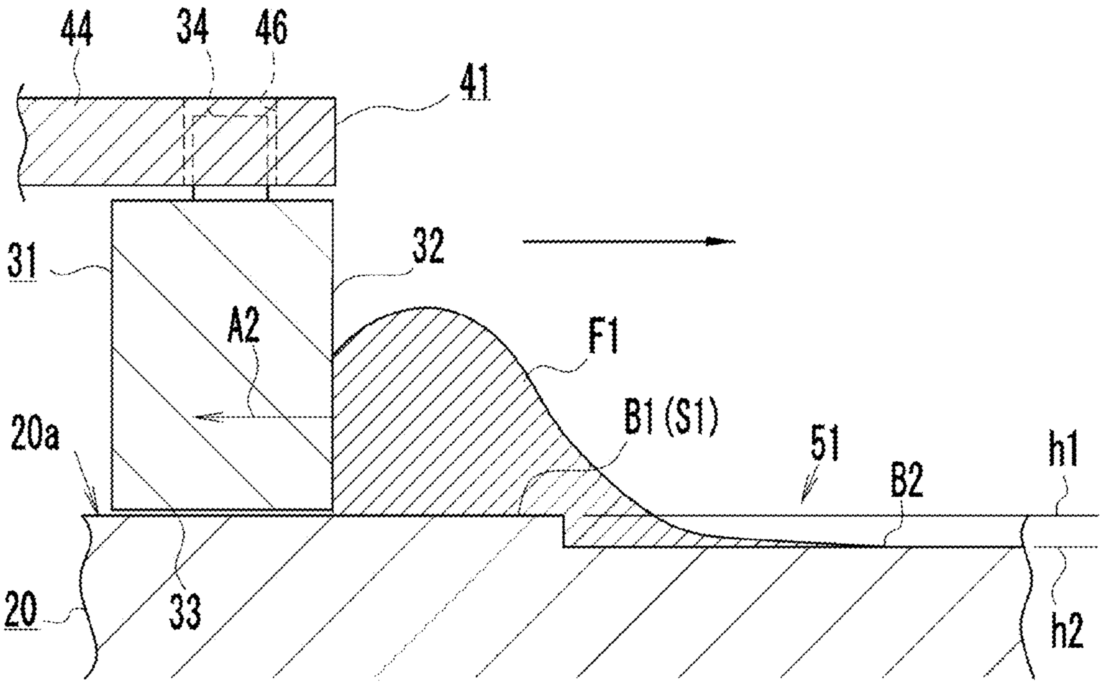
FIG. 8 is a schematic longitudinal cross-sectional view of a dip plate, a squeegee, and a squeegee holding mechanism according to Example 2.

Hereinafter, flux transfer device 10 according to Example 2 will be described with reference to FIG. 8. In the present example, a configuration different from that of Example 1 will be mainly described. Components that are common to that of Example 1 will be given common member numbers, and detailed descriptions thereof will be omitted. In flux transfer device 10 of Example 1 described above, side surface 32 of squeegee 31 on the traveling direction side has an upward inclination with respect to bottom surface 20*a* of dip plate 20. On the other hand, in flux transfer device 10 of the present example illustrated in FIG. 8, side surface 32 of squeegee 31 on the traveling direction side is not inclined and is at right angles. That is, side surface 32 has a positional relationship perpendicular to bottom surface 20*a* of dip plate 20 and lower surface 33 of squeegee 31. Accordingly, when squeegee 31 relatively moves along bottom surface 20*a* of dip plate 20, an external force (arrow A2 in FIG. 8) from flux F1 in the horizontal direction acts on perpendicular lower surface 33. In addition, a downward force based on the weight of squeegee 31 also acts on side surface 32 on the traveling direction side. As a result, squeegee 31 is held at a position in the vertical direction determined by the resultant force. In this case, since at least no upward force acts on squeegee 31, squeegee 31 is no longer floated or inclined, and the film thickness of flux F1 is stabilized. Therefore, flux film F2 having a desired film thickness is formed on bottom surface 20*a* of dip plate 20.

Hereinbefore, although Examples 1 and 2 have been described, the specific aspect is not limited to Examples 1 and 2 described above. In Example 1 described above, the inclination angle of side surface 32 of squeegee 31 on the traveling direction side is constant; however, the configuration is not limited to this. For example, in another example, the inclination angle of side surface 32 of squeegee 31 on the traveling direction side need not be constant. In other words, in Example 1, although the cross-sectional shape of side surface 32 on the traveling direction side is linear, in another example, the cross-sectional shape of side surface 32 on the traveling direction side may be curved. In addition, in Example 1 described above, the entire area of side surface 32 on the traveling direction side has the same inclination angle: however, the configuration is not limited to this. For example, in another example, only the lower region of side surface 32 on the traveling direction side may have an inclination angle.

In addition, in Examples 1 and 2 described above, the liquid to be transferred is flux F1: however, the configuration is not limited to this. For example, in another example, the liquid may be a liquid containing flux F1 as one component. Furthermore, the liquid may be various liquids (liquid or fluid substance) used when electronic component 101 or the like as the transfer target is bonded onto the circuit board. Examples of such a liquid include cream solder and adhesive.

In addition, in Examples 1 and 2 described above, the present disclosure is applied to rotary flux transfer device 10 that rotates and squeezes dip plate 20 (transfer table); however, the configuration is not limited to this. For example, in another example, the present disclosure may be applied to a linear flux transfer device in which the transfer table is fixed and squeegee 31 is linearly moved in the horizontal direction, or squeegee 31 is fixed and the transfer table is linearly moved in the horizontal direction.

In addition, in Examples 1 and 2 described above, first bottom surface portion B1 of dip plate 20 also serves as stopper S1 that restricts the downward movement of squeegee 31 by abutting on lower surface 33 of squeegee 31: however, the configuration is not limited to this. For example, in another example, stopper S1 may be provided in a portion other than first bottom surface portion B1 of dip plate 20, and the movement of squeegee 31 in the down direction may be restricted by stopper S1. A portion (abutted portion) of squeegee 31 that abuts on stopper S1 need not be lower surface 33, and may be another portion.

In addition, in Examples 1 and 2 described above, one recessed portion 51 is formed in bottom surface 20*a* of dip plate 20; however, the configuration is not limited to this. For example, in another example, a recessed portion is not formed on the bottom surface of the dip plate, and the bottom surface may have a uniform height. Even in such a configuration, since the side surface of the squeegee on the traveling direction side is inclined upward with respect to the bottom surface, it is possible to suppress the floating or inclining of the squeegee and stabilize the film thickness of the flux. In still another example, such recessed portion 51 may be provided at multiple positions. Multiple recessed portions 51 may have the same depth or different depths. A device including multiple recessed portions 51 having different depths can correspond to multiple different film thicknesses. The shapes and sizes of multiple recessed portions 51 in plan view may be equal or different.

In addition, in Examples 1 and 2 described above, a method is adopted in which squeegee 31 is fixed and unfixed using fixing dial 45 rotatable to two positions: however, the configuration is not limited to this. For example, in another example, a method may be adopted in which squeegee 31 is fixed and unfixed using a fixed lever or the like rotatable to two positions.

While specific examples of the present disclosure have been described in detail above, these are illustrative only and are not intended to limit the scope of the claims. The technique described includes various modifications and changes to the specific examples described above. The technical elements described in the present description or the drawings exhibit technical usefulness alone or in various combinations and are not limited to the combinations described in the claims as filed. In addition, the techniques illustrated in the present description or the drawings can simultaneously achieve multiple objects and provide technical usefulness by achieving one object itself in multiple objects.

REFERENCE SIGNS LIST

10: Flux transfer device as liquid transfer device, 20: Dip plate as transfer table, 20*a*: Bottom surface, 31: Squeegee, 32: Side surface on traveling direction side, 41: Squeegee holding mechanism, 101: Electronic component as transfer target, B1: First bottom surface portion, B2: Second bottom surface portion, h1: First height, h2: Second height, F1: Flux as liquid, F2: Flux film as liquid film, S1: Stopper

The invention claimed is:

1. A liquid transfer device comprising:

a transfer table configured to have a bottom surface on which a liquid film is formed, and transfer a liquid to a transfer target by immersing the transfer target in the liquid film;

a squeegee disposed above the transfer table and configured to push and spread the liquid on the transfer table by relatively moving along the bottom surface of the transfer table to form the liquid film; and a squeegee holding mechanism configured to hold the squeegee to be movable in a vertical direction, wherein the bottom surface of the transfer table includes a first bottom surface portion located at a first height and a second bottom surface portion located at a second height lower than the first height, the second bottom surface portion defines a location to transfer the liquid to the transfer target and a film thickness of the liquid, the squeegee has a side surface on a traveling direction side in contact with the liquid when the squeegee relatively moves along the bottom surface of the transfer table, the side surface of the squeegee has an upward inclination or is perpendicular to the bottom surface of the transfer table, and the squeegee holding mechanism moves the squeegee in the vertical direction to abut the first bottom surface portion and then the squeegee is moved over the second bottom surface portion.

2. The liquid transfer device according to claim 1, wherein the first bottom surface portion is a stopper configured to restrict a downward movement of the squeegee by abutting on the squeegee.

3. The liquid transfer device according to claim 1, wherein the film thickness of the liquid is a difference between the first height and the second height.

4. The liquid transfer device according to claim 1, wherein a length of the second bottom surface portion is less than a length of the squeegee.

5. The liquid transfer device according to claim 1, wherein the squeegee is moved over the second bottom surface portion by rotating the transfer table.

* * * * *